United States Patent [19]

Sasaki

[11] Patent Number: 5,241,495
[45] Date of Patent: Aug. 31, 1993

[54] SEMICONDUCTOR MEMORY

[75] Inventor: Masayoshi Sasaki, Tokyo, Japan

[73] Assignee: Sony Corporation, Tokyo, Japan

[21] Appl. No.: 627,600

[22] Filed: Dec. 14, 1990

[30] Foreign Application Priority Data

Dec. 15, 1989 [JP] Japan .................................. 324996
Dec. 28, 1989 [JP] Japan .................................. 342708

[51] Int. Cl.$^5$ .......................... G11C 5/02; H01L 27/10
[52] U.S. Cl. ......................................... 365/51; 365/63; 365/154
[58] Field of Search ............... 365/51, 63, 154, 156; 257/379, 67

[56] References Cited

U.S. PATENT DOCUMENTS 4,541,006 9/1985 Ariizumi et al. ............... 365/154 X
4,853,894 8/1989 Yamanaka et al. .............. 365/154

FOREIGN PATENT DOCUMENTS 0087979 7/1983 European Pat. Off. .

OTHER PUBLICATIONS

IEEE Journal of Solid-State Circuits, vol. SC-13, No. 5, Oct. 1978 entitled "DSA 4K Static RAM", by Y. Torimaru et al., pp. 647-650.
IEEE Journal of Solid-State Circuits, Oct. 24, 1989, No. 5, entitled "A 9-ns 1-Mbit CMOS Sram", by K. Sasaki et al., pp. 1219-1225.

Primary Examiner—Joseph A. Popek
Attorney, Agent, or Firm—Hill, Steadman & Simpson

[57] ABSTRACT

In a stacked CMOS SRAM of this invention, a power source line connected to a load transistor of a flip-flop constituting a memory cell extends above a boundary line between memory cells, and a power source line shunt is formed by the same conductive layer as that of a ground line or a gate electrode of the load transistor.

13 Claims, 5 Drawing Sheets

SEMICONDUCTOR MEMORY

CROSS-REFERENCES TO RELATED APPLICATIONS

This application is related to application Ser. No. 07/757,301 filed Sep. 10, 1091 entitled "Semiconductor Memory Device" which is assigned to the assignee of the present invention.

BACKGROUND OF THE INVENTION

1. Field of the Invention.

The present invention relates to a semiconductor memory called a stacked CMOS SRAM in which a load transistor of a flip-flop constituting a memory cell is formed of a semiconductor layer on a semiconductor substrate.

2. Description of the Prior Art

In a resistance load MOS SRAM generally used as a conventional MOS SRAM, it has become difficult to maintain a high memory retention capacity level while a standby current is kept low.

In order to provide a countermeasure against the above drawback, a full CMOS SRAM having a memory cell shown in FIG. 1 is proposed. And further, in order to reduce a chip area of the full CMOS SRAM to that of a resistance load MOS SRAM, there is proposed a so-called stacked CMOS SRAM wherein load PMOS transistors 12 and 13 of a flip-flop 11 constituting a memory cell are formed by thin film transistors, and these thin film transistors are stacked on driver NMOS transistors 14 and 15 and transfer NMOS transistors 16 and 17 formed by bulk transistors (e.g., "Nikkei Microdevice" (September, 1988), pp. 123-130).

FIG. 2 shows an example of such a stacked CMOS SRAM. In this SRAM, impurity diffused regions 21a to 21g serving as source/drain regions of the driver NMOS transistors 14 and 15 and transfer NMOS transistors 16 and 17 are formed in a semiconductor substrate.

Gate electrodes 14a to 17a of the transistors 14 to 17 are formed by a first poly-Si layer on an insulating film (not shown) on the semiconductor substrate. Note that the gate electrodes 16a and 17a are parts of a word line 22.

The gate electrode 14a is connected to the impurity diffused region 21d, and the gate electrode 15a is connected to the impurity diffused regions 21b and 21f.

The gate electrodes 14a and 15a, the word line 22 and a surface of the semiconductor substrate are covered with an insulating interlayer (not shown). The gate electrodes 12a and 13a of the PMOS transistors 12 and 13 are formed by a second poly-Si layer on this insulating interlayer.

As described above, the gate electrodes 12a and 13a are made of a poly-Si layer different from that of the gate electrodes 14a and 15a and can have a length different from that of the gate electrodes 14a and 15a, as is apparent from FIG. 2.

Gate electrodes 12a and 13a are respectively connected to the gate electrodes 14a and 15a through contact holes 23 and 24 formed in the underlying insulating interlayer.

The gate electrodes 12a and 13a and the like are covered with a gate insulating film (not shown). On this gate insulating film, a power source line 25 and active layers 26 and 27 of the PMOS transistors 12 and 13 which are connected to this power source line 25 are made of a third poly-Si layer.

Drain regions of the active layers 26 and 27 are respectively connected to the gate electrodes 15a and 12a through contact holes 31 and 32 formed in the underlying insulating film.

The power source line 25, the active layers 26 and 27 and the like are covered with an insulating interlayer (not shown), and a ground line 33 made of a first Al layer is formed on this insulating interlayer.

The ground line 33 is connected to the impurity diffused region 21c and the like through a contact hole 34 and the like formed in the underlying insulating film.

The ground line 33 and the like are covered with an insulating interlayer (not shown). Bit lines 35 and 36 are made of a second Al layer on this insulating interlayer.

The bit lines 35 and 36 are respectively connected to the impurity diffused regions 21g and 21e through contact holes 37 and 38 formed in the underlying insulating film.

The impurity diffused regions 21g and 21e and the contact holes 37 and 38 are shared by two adjacent memory cells formed in a direction perpendicular to the word line 22 and are formed on the boundary line of these memory cells.

As is apparent from the above description, in the stacked CMOS SRAM, it is most effective to form the active layers 26 and 27 of the PMOS transistors 12 and 13 and the power source line 25 by a single poly-Si layer when the fabrication process is taken into consideration.

In order to form the active layers 26 and 27 and the power source line 25 by a single poly-Si layer, gaps S exceeding at least the limit of the lithographic process must be assured between the active layers 26 and 27 and the power source line 25.

In order to assure the layout of the active layers 26 and 27 and the power source line 25, the memory cell area must also be assured. Therefore, it is not easy to increase the packing density of the conventional example shown in FIG. 2.

On the other hand, in such a stacked CMOS SRAM, it is very important to reduce OFF leakage currents of the PMOS transistors 12 and 13 in order to decrease current consumption and improve data retention characteristics. As a method of realizing this, a method of forming a thin poly-Si layer to constitute the active layers 26 and 27 of the PMOS transistors 12 and 13 is considered to be most promising.

In the stacked CMOS SRAM, the power source line 25 is generally formed by the same poly-Si layer as that constituting the active layers 26 and 27 of the PMOS transistors 12 and 13.

When a thin poly-Si layer is formed as described above, an electric resistance of the power source line 25 is increased, and a high-speed operation and operational stability of the memory cells are disadvantageously degraded.

On the other hand, in order to solve the above problem, when an additional conductive layer is formed to reduce the resistance of the power source line 25, the memory cell area is increased, and the fabrication process is complicated.

OBJECTS AND SUMMARY OF THE INVENTION

It is, therefore, an object of the present invention to provide a semiconductor memory capable of reducing a memory cell area and increasing the packing density.

It is another object of the present invention to provide a semiconductor memory having a low parasitic resistance of a power source line even if a conductive layer for the power source line has a small thickness without increasing the memory cell area and without complicating the fabrication process.

In the semiconductor memory according to the present invention, the power source line extends along the boundary line between adjacent memory cells. Even if the load transistors and the power source line are made of the same semiconductor layer, the load transistors can be laid out in an upper region of the memory cell without being interfered with the power source line. Therefore, a sufficient layout margin of the load transistors can be obtained.

In addition, even if the contact portions of the transfer transistors to be connected to the bit lines are formed on the boundary line between adjacent memory cells, the contact portions and the bit lines are connected to each other through conductive layers at positions spaced apart from the boundary line. Therefore, even if the bit lines are formed in a layer above the power source line, no problem is posed in connections between the transfer transistors and the bit lines.

As described above, no problem is posed in the connections between the transfer transistors and the bit lines, and at the same time a sufficient layout margin for the load transistors is assured. Therefore, the memory cell area can be reduced, and the packing density can be increased.

In the memory cell according to the present invention, although the power source line shunt is formed, a conductive layer corresponding to the shunt generally has a sufficient layout margin as compared with a conductive layer constituting the gate electrodes of the driver and transfer transistors.

The conductive layer corresponding to the power source line shunt originally serves as a conductive layer constituting the ground line or the gate electrodes of the load transistors. The conductive layer corresponding to the power source line shunt is not an additional conductive layer.

As described above, since the conductive layer corresponding to the power source line shunt has a sufficient layout margin, the memory cell area need not be increased. In addition, since the conductive layer corresponding to the power source line shunt is not an additional conductive layer, the fabrication process is not complicated. Notwithstanding, a parasitic resistance of the power source line can be kept low even if the thickness of the conductive layer as the power source line is decreased.

DETAILED DESCRIPTION OF THE PREFERRED EMBODIMENTS

Figure 1:
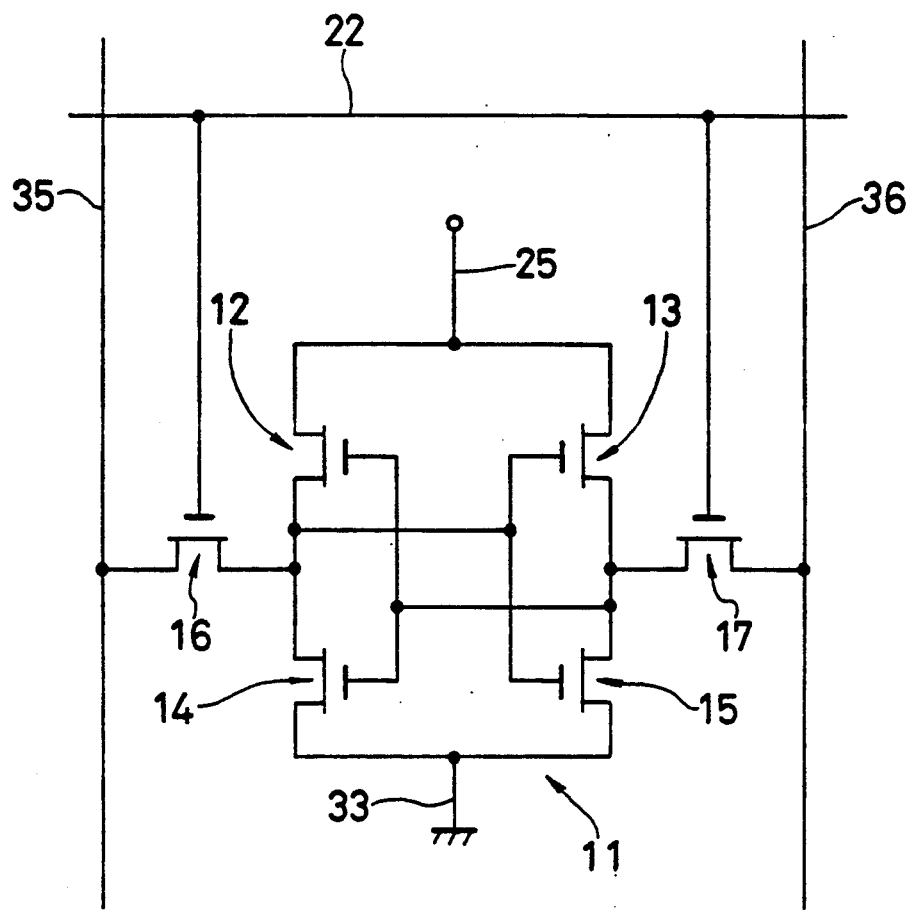
FIG. 1 is an equivalent circuit diagram of a full CMOS SRAM memory cell which can employ the present invention.

The first to third embodiments of the present invention will be described with reference to FIGS. 3 to 5. The same reference numerals as in the conventional example of FIG. 2 denote the same parts in FIGS. 3 to 5, and a detailed description thereof will be omitted.

Figure 3:
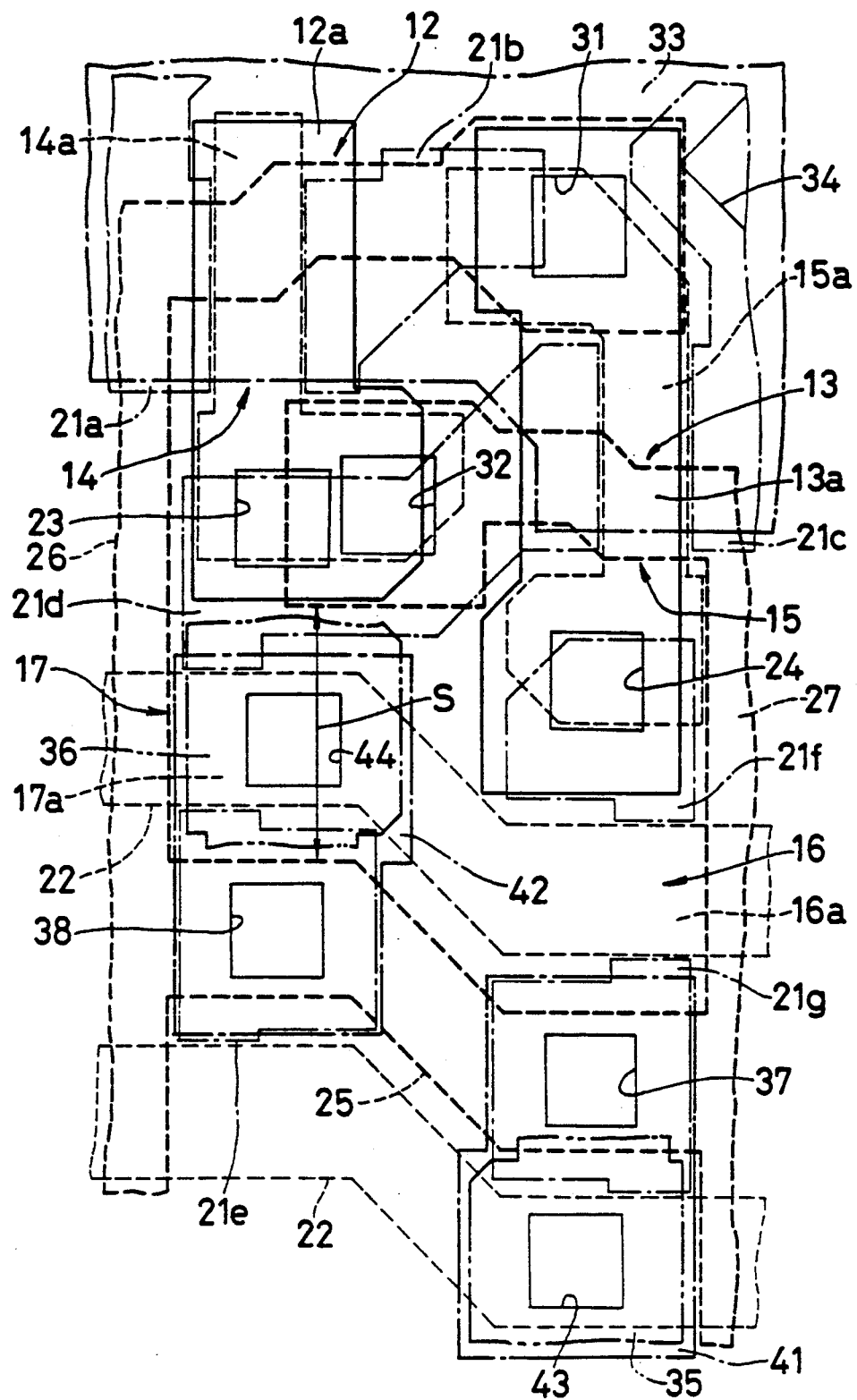
FIGS. 3 to 5 are plan views showing the first to third embodiments of the present invention.

FIG. 3 shows the first embodiment. In the first embodiment, a ground line 33 is made of a second poly-Si layer, and conductive layers 41 and 42 extending from impurity diffused regions 21g and 21e to a word line 22 in a staggered manner are also made of the second poly-Si layer.

Contact holes 37 and 38 are formed in an insulating film formed under the conductive layers 41 and 42. The conductive layers 41 and 42 are connected to the impurity diffused regions 21g and 21e through these contact holes 37 and 38, respectively.

Gate electrodes 12a and 13a of PMOS transistors 12 and 13 are made of a third poly-Si layer, and a power source line 25 and active layers 26 and 27 of the PMOS transistors 12 and 13 are made of a fourth poly-Si layer.

Figure 2:
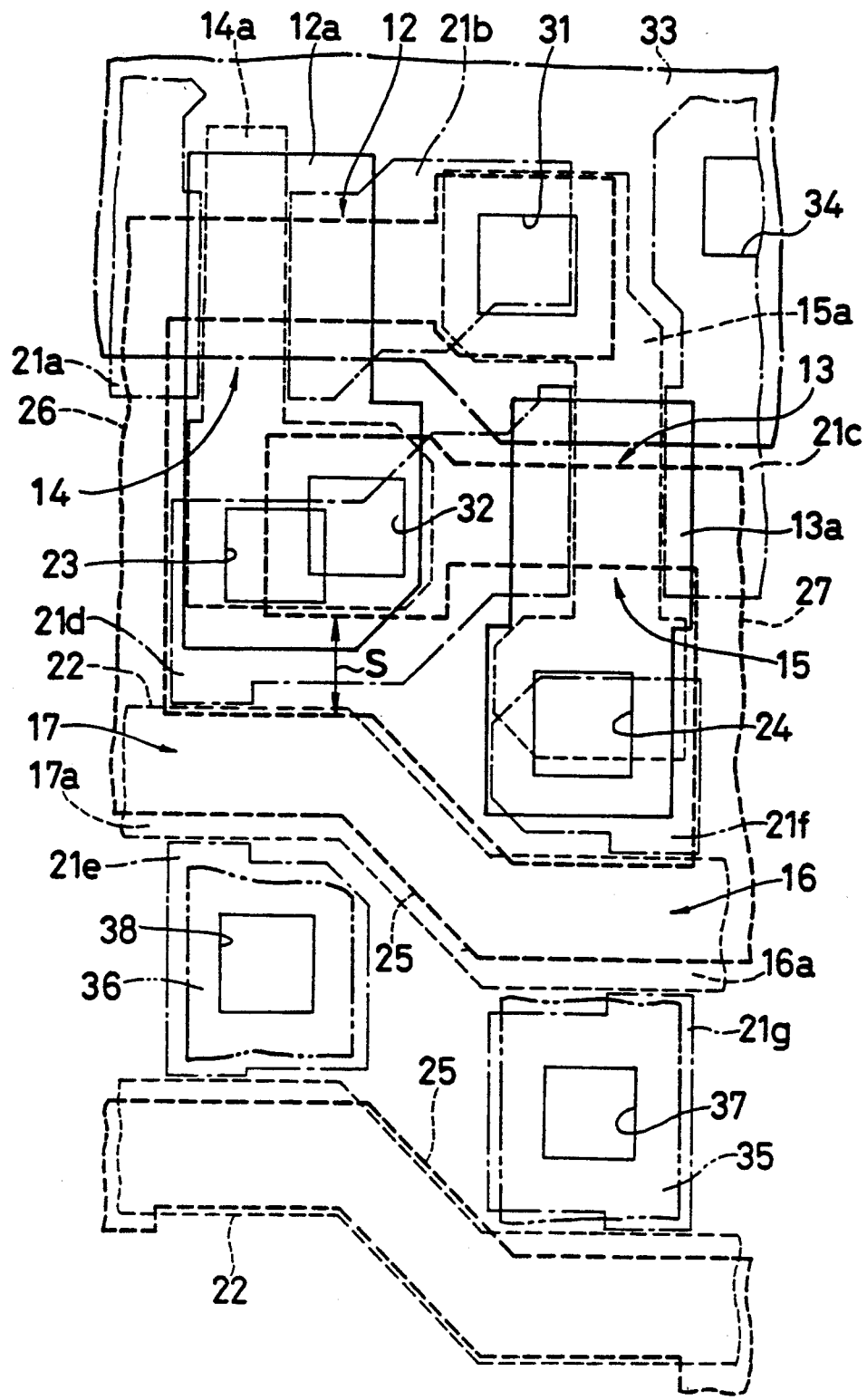
FIG. 2 is a plan view showing a conventional example.

In the first embodiment, unlike the conventional example shown in FIG. 2, the power source line 25 does not extend above the word lines 22, but extends between the word lines 22, that is, above a boundary line between adjacent memory cells so as to share the impurity diffused regions 21g and 21e. Therefore, the power source line 25 is also shared by two adjacent memory cells.

A contact hole 31 is formed in an insulating layer between a drain region of the active layer 26 and the gate electrode 13a. The drain region of the active layer 26 is connected to the gate electrode 13a through this contact hole 31.

Bit lines 35 and 36 are made of an Al layer and are respectively connected to the conductive layers 41 and 42 through contact holes 43 and 44 formed in the underlying insulating interlayer above the word lines 22. Therefore, the bit lines 35 and 36 are connected to the impurity diffused regions 21g and 21e through the conductive layers 41 and 42, respectively.

In the first embodiment described above, since the power source line 25 extends above the boundary line between two adjacent memory cells, a sufficiently large gap S can be assured. Therefore, with a decrease in gap S, the memory cell area can be reduced and the packing density of the memory can be increased.

Figure 4:
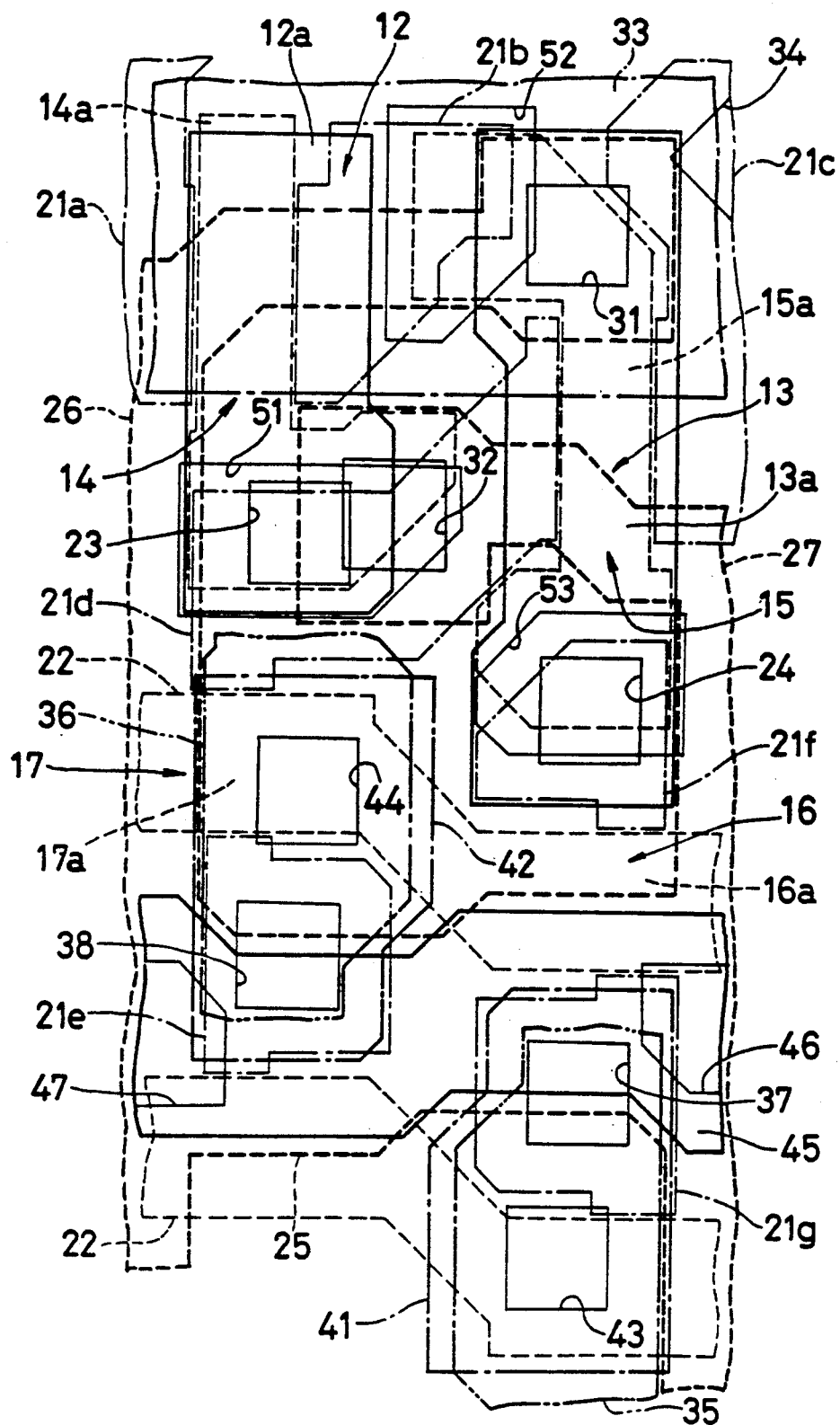

FIG. 4 shows the second embodiment. The second embodiment has substantially the same structure as that of the first embodiment (FIG. 3) except that a shunt 45 of a power source line 25 is formed by a third poly-Si layer which forms gate electrodes 12a and 13a of PMOS transistors 12 and 13, and that the power source line 25 is connected to the shunt 45 through contact holes 46 and 47 and the like formed in an insulating interlayer formed under the power source line 25.

A gate electrode 14a is connected to an impurity diffused region 21d through a contact hole 51 formed in an insulating film formed on a semiconductor substrate. A gate electrode 15a is connected to the impurity diffused regions 21b and 21f through contact holes 52 and 53.

In the second embodiment described above, as is apparent from FIG. 4, the shunt 45 extends almost above a boundary line between two memory cells adjacent in a direction perpendicular to the word lines 22.

For this reason, even if both the gate electrodes 12a and 13a of the PMOS transistors 12 and 13 and the shunt 45 are formed by the third poly-Si layer, the gate electrodes 12a and 13a are perfectly isolated from the shunt 45, and therefore the shunt 45 can serve as a shunt for the power source line 25.

Therefore, even if the thickness of active layers 26 and 27 and the power source line 25 is decreased to about 100 Å in order to reduce OFF leakage currents of the PMOS transistors 12 and 13, and even if a sheet resistance of these layers and line becomes about $10^4$ $\Omega/\square$, a composite sheet resistance of the power source line 25 and the shunt 45 can be reduced to $2 \times 10^2$ $\Omega/\square$ under the condition that the thickness of the shunt 45 is set to be about 1,000 Å.

Even if the shunt 45 and the power source line 25 are almost present on the boundary line between the two memory cells, no problem occurs in connections between bit lines 35 and 36 and impurity diffused regions 21g and 21e because the bit lines 35 and 36 are connected to conductive layers 41 and 42.

In the second embodiment described above, the gate electrodes 12a and 13a of the PMOS transistors 12 and 13 and the shunt 45 are formed of a third poly-Si layer, and the power source line 25 and the active layers 26 and 27 are formed of a fourth poly-Si layer. However, these layers may be reversed.

Figure 5:
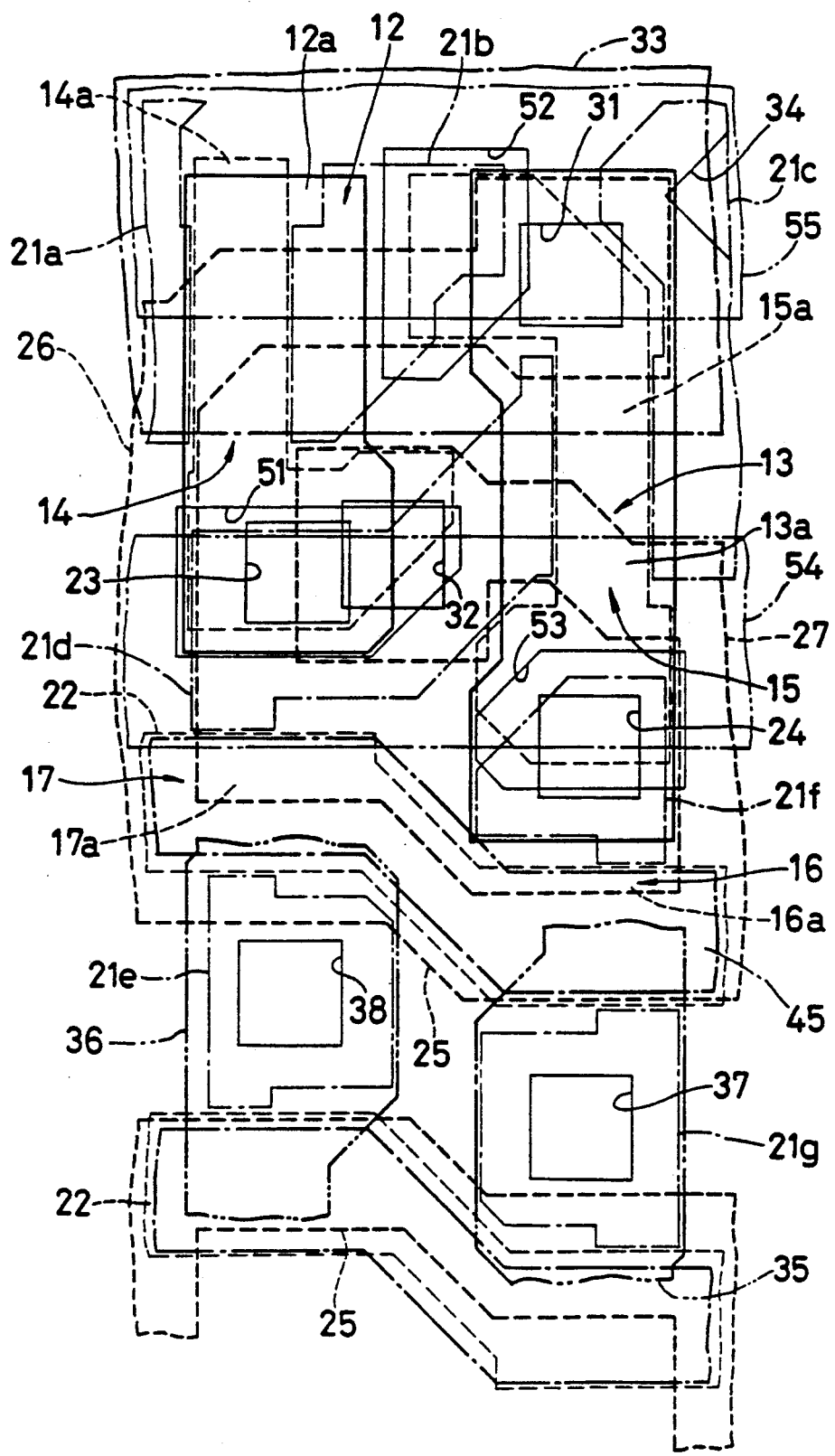

FIG. 5 shows the third embodiment. The third embodiment is substantially the same as the second embodiment of FIG. 4, except that a shunt 45 of a power source line 25 is formed of a second poly-Si layer which also forms a ground line 33, that the shunt 45 and the power source line 25 extend on word lines 22, and that a shunt 54 of the word line 22 and a shunt 55 of the ground line 33 are formed of a second Al layer which is higher than bit lines 35 and 36.

The bit lines 35 and 36 are directly connected to impurity diffused regions 21g and 21e through contact holes 37 and 38, respectively. The power source line 25, the word lines 22, the ground lines 36 and the shunts 45, 54 and 55 thereof are connected to each other every several memory cells in a region between memory cells.

In the third embodiment described above, since the shunt 45 is formed for the power source line 25, a decrease in thickness of active layers 26 and 27 and the power source line 25 to decrease OFF leakage currents of PMOS transistors 12 and 13 allows a low composite sheet resistance of the power source line 25 and the shunt 45.

The shunts 54 and 55 of the word lines 22 and the ground line 33 can be made of a refractory metal layer, and the shunts 54 and 55 can be formed below the bit lines 35 and 36. The shunt 45 of the power source line 25 may be exchanged with the shunt 54 of the word line 22.

What is claimed is:

1. A semiconductor memory having memory cells each consisting of a flip-flop and a pair of transfer transistors, said flip-flip having load transistors formed of a semiconductor layer formed on a semiconductor substrate, said transfer transistors to be connected to bit lines being provided with contact portions located on a boundary line between two adjacent memory cells, wherein
   a power source line formed on said substrate and connected to said load transistors and extends above the boundary line thereof, and
   conductive layers formed on said substrate and connected to said contact portion and also connected to said bit lines at positions which are separated from the boundary line and said power source line not connected to said bit lines.

2. A memory according to claim 1, wherein said power source line is shared by said two adjacent memory cells defining the boundary line.

3. A memory according to claim 1, wherein said conductive layers extend from said contact portions to the gate electrodes of said transfer transistors and are connected to said bit lines on said gate electrodes.

4. A memory according to claim 3, wherein said conductive layers alternately extend to said gate electrodes of said two adjacent memory cells which define the boundary line.

5. A semiconductor memory having memory cells each consisting of a flip-flop and a pair of transfer transistors, said flip-flop being constituted by a pair of driver transistors connected to a ground line and a pair of load transistors connected to a power source line, wherein
   gate electrodes of said drive transistors and said transfer transistors made of a first conductive layer formed on a semiconductor substrate, said ground line made of a second conductive layer formed on said semiconductor substrate, gate electrodes of said load transistors formed on a third conductive layer formed on said semiconductor substrate, active layers which form channels of said load transistors and said power source line, made of a forth conductive layer on said semiconductor substrate, and
   a shunt of said power source line is formed of said second or third conductive layer.

6. A memory according to claim 5, wherein
   contact portions of said transfer transistors to be connected to bit lines are located on a boundary line define by two adjacent memory cells,
   said shunt is formed of said third conductive layer, which forms said gate electrodes of said load transistors,
   said power source line and said shunt extend above the boundary line therealong, and
   said second conductive layer which forms said ground line is connected to said contact portion, and extends from said contact portion to said gate electrode of said transfer transistor, and is connected to said bit line on said gate electrode.

7. A memory according to claim 5, wherein
   said second conductive layer which forms said ground line forms said shunt, and
   said power source line and said shunt extend on said gate electrodes of said transfer transistors.

8. A semiconductor memory having memory cells each consisting of a flip-flop and a pair of transfer transistors (16, 17), said flip-flop (11) having load transistors (12, 13) formed on a semiconductor layer on a semiconductor substrate, output nodes of said transfer transistors (126, 17) to be connected to bit lines (35, 36) being provided with first bit line contacts (37, 38) which lie between word lines (22, 22) of adjacent memory cells in a direction perpendicular to the word lines,
   wherein a power source line (25), which is formed of a semiconductor layer of same conductivity as source electrodes of said load transistors (12, 13), located above said bit lines (35, 36) and runs between word lines (22, 22) of adjacent memory cells therealong,
   and wherein said bit lines (35, 36) are connected to conductive layer (41, 42) through second bit line contacts (43, 44) formed in the insulating interlayer overlaying said conductive layers (431, 42) formed in the insulating interlayer overlying said conductive layers (431, 42) above said word lines (22, 22), and said conductive layers (41, 42) are connected to said output nodes of said transfer transistors (16, 17) through said first bit line contacts (37, 38).

9. A memory according to claim 8, wherein said semiconductor layers extend from said first bit line contact to upper parts of gate electrodes of said transfer transistors and spaced from said gate electrodes and connected to said bit lines on said gate electrodes at said second bit line contacts.

10. A memory according to clam 9 wherein said semiconductor layers extend from said contact portions to upper parts of gate electrodes of said transfer transistors of said adjacent memory cells in a direction perpendicular to the word lines.

11. A semiconductor memory according to claim 8 wherein a shunt (45) of the said power source line (25) is formed of same semiconductor layer as a semiconductor layer which forms said ground line or gate electrodes of said load transistors.

12. A memory according to claim 11, wherein contact portions of said transfer transistors to be connected to bit lines lying between word lines of adjacent memory cells, wherein said power source and said shunt lie between word lines of adjacent memory cells in a direction perpendicular to the word lines therealong, and said conductive layers (41, 42) for output of memory cells are the same layers as a layer which forms a ground line for output of memory cells and are connected to said first bit line contact and said second bit line contact.

13. A memory according to claim 11, wherein said ground line and said shunt are formed of same conductive layer, and said power source line and said shunt extend on said gate electrodes of said transfer transistors.

* * * * *